(12) United States Patent
Watanabe et al.

(10) Patent No.: US 7,019,340 B2
(45) Date of Patent: Mar. 28, 2006

(54) BIPOLAR TRANSISTOR DEVICE AND METHOD FOR FABRICATING THE SAME

(75) Inventors: Daisuke Watanabe, Takatsuki (JP); Mitsuru Tanabe, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/184,999

(22) Filed: Jul. 1, 2002

(65) Prior Publication Data
US 2003/0011000 A1 Jan. 16, 2003

(30) Foreign Application Priority Data
Jul. 5, 2001 (JP) ............................. 2001-204216

(51) Int. Cl.
*H01L 21/00* (2006.01)

(52) U.S. Cl. ....................... 257/197; 257/200

(58) Field of Classification Search ................ 257/189, 257/190, 191, 192, 193, 194, 75, 76, 77, 257/78, 95, 96, 98, 200, 103, 199, 201, 203, 257/204, 205, 198, 197, 196, 565
See application file for complete search history.

(56) References Cited

U.S. PATENT DOCUMENTS

| | | | | |
|---|---|---|---|---|
| 4,119,994 A | * | 10/1978 | Jain et al. | 257/198 |
| 4,985,742 A | * | 1/1991 | Pankove | 257/197 |
| 5,604,357 A | * | 2/1997 | Hori | 257/24 |
| 5,641,975 A | * | 6/1997 | Agarwal et al. | 257/76 |
| 5,670,798 A | * | 9/1997 | Schetzina | 257/96 |
| 5,679,965 A | * | 10/1997 | Schetzina | 257/103 |
| 5,981,986 A | * | 11/1999 | Tsuchiya | 257/200 |
| 6,046,464 A | * | 4/2000 | Schetzina | 257/96 |
| 6,106,613 A | * | 8/2000 | Sato et al. | 117/54 |
| 6,432,786 B1 | * | 8/2002 | Chen et al. | 438/305 |
| 6,432,788 B1 | * | 8/2002 | Maruska et al. | 438/328 |
| 6,462,360 B1 | * | 10/2002 | Higgins, Jr. et al. | 257/189 |
| 6,472,694 B1 | * | 10/2002 | Wilson et al. | 257/189 |
| 6,498,360 B1 | * | 12/2002 | Jain et al. | 257/194 |
| 2004/0129200 A1 | * | 7/2004 | Kouvetakis et al. | 117/2 |

OTHER PUBLICATIONS

Riley et al ("Advancements in SiGe Epitaxy for Production Applications", Semiconductor Fabtech 267-269 (http://www.semiconductorfabtech.com/journals/edition.09/download/ft09-06¯07.pdf)□□□□.*
T. Lei et al., "Epitaxial growth and characterization of zinc-blende gallium nitride on (001) silicon", J. Appl. Phys., vol. 71, No. 10, pp. 4933-4943, May 15, 1992.
M. Kondow et al., "Novel Material, GaNAs, for Compound Semiconductor formed on Si Wafer", Technical Report of IEICE. OPE94-103, pp. 25-30, Dec. 1994.
S. Guha et al., "Transplanted Si films on arbitrary substrates using GaN underlayers", Appl. Phys. Lett., vol. 76, No. 10, pp. 1264-1266, Mar. 6, 2000.

* cited by examiner

*Primary Examiner*—Laura M. Schillinger
(74) *Attorney, Agent, or Firm*—Nixon Peabody LLP; Donald R. Studebaker (57) ABSTRACT

A bipolar transistor device having first and second semiconductor layers each formed on a substrate and composed of a Group III–V compound semiconductor of a first conductivity type and a third semiconductor layer formed between the first and second semiconductor layers and composed of a group IV semiconductor of a second conductivity type.

2 Claims, 9 Drawing Sheets

BIPOLAR TRANSISTOR DEVICE AND METHOD FOR FABRICATING THE SAME

BACKGROUND OF THE INVENTION

The present invention relates to a bipolar transistor device and to a method for fabricating the same. More particularly, it relates to a heterobipolar transistor device using a semiconductor containing silicon (Si) and a semiconductor containing a gallium nitride (GaN) and to a method for fabricating the same.

Figure 9A:
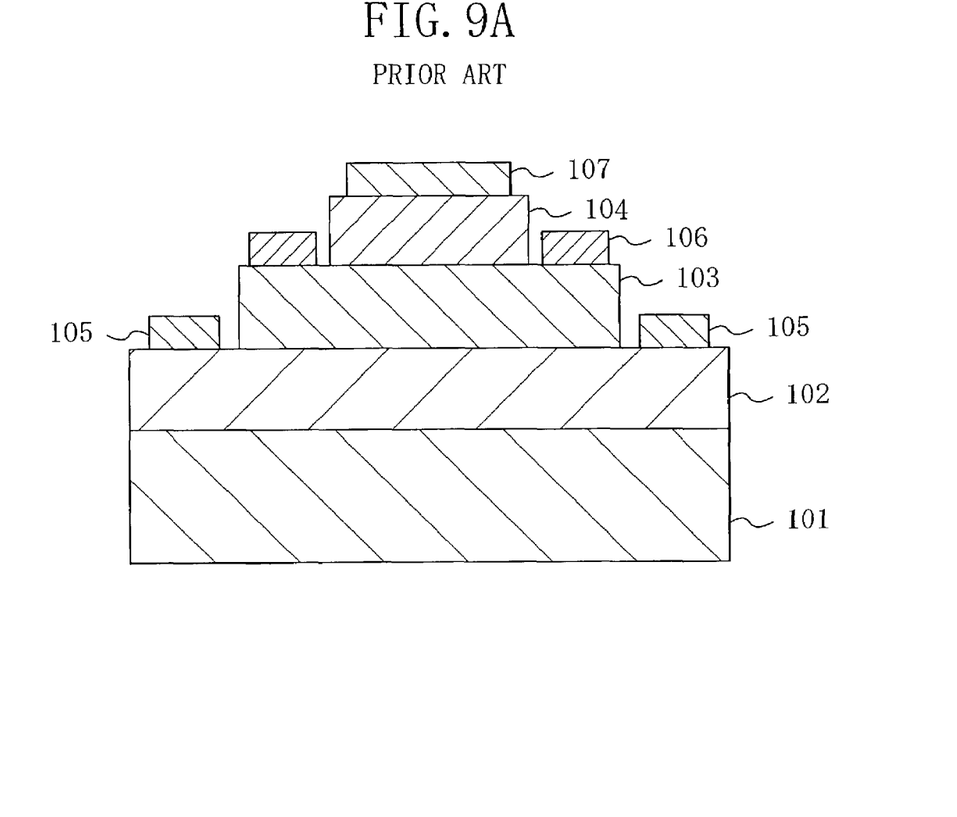

FIG. 9A shows a cross-sectional structure of a conventional embodiment of a so-called SiGe heterobipolar transistor (hereinafter referred to as SiGe HBT) using silicon (Si) and germanium (Ge). As shown in FIG. 9A, the SiGe HBT according to the conventional embodiment has: a collector layer 102 composed of n-type silicon (Si); a base layer 103 composed of a p-type silicon germanium (SiGe); and an emitter layer 104 composed of n-type silicon (Si), which are formed successively on a semiconductor substrate 101 composed of p-type silicon.

The base layer 103 is formed to have a mesa configuration on the collector layer 102. A collector electrode 105 is disposed on the collector layer 102 to surround the base layer 103. The emitter layer 104 is also formed to have a mesa configuration on the base layer 103. A base electrode 106 is disposed on the base layer 103 to surround the emitter layer 104, while an emitter electrode 107 is disposed on the upper surface of the emitter layer 104.

Figure 9B:
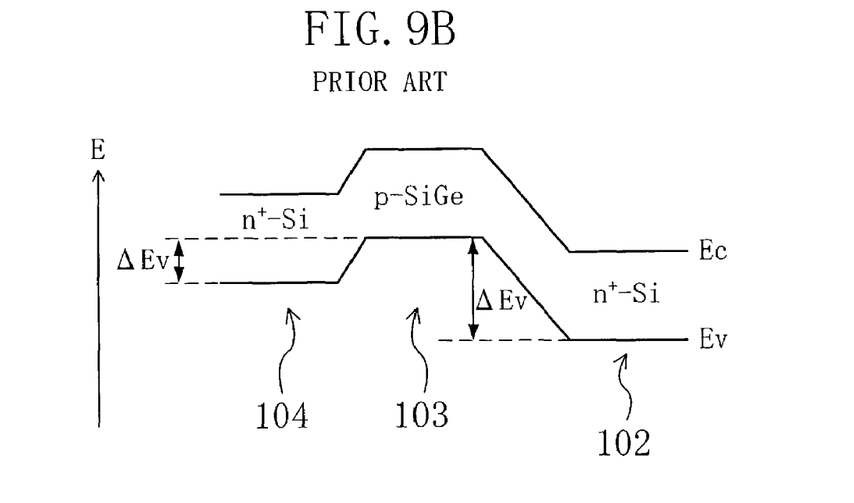

As shown in the electron energy band diagram of FIG. 9B for the SiGe HBT according to the conventional embodiment, the emitter layer 104 is composed of silicon (Si) which is a semiconductor material having a larger band gap than a silicon germanium (SiGe) composing the base layer 103. Compared with a typical bipolar transistor composed of Si, the bipolar transistor according to the conventional embodiment can suppress the injection of holes from the base layer 103 to the emitter layer 104 so that the impurity concentration of the base layer 103 is increased. The arrangement increases the current gain of the transistor and reduces the sheet resistance of the base layer 103 so that a current-gain cutoff efficiency $f_T$ and a maximum oscillation frequency $f_{max}$ are increased.

Since the SiGe HBT according to the conventional embodiment is a double heterobipolar transistor (DHBT) using Si also for the collector layer 102, the energy difference between respective valence bands in the collector and base layers 102 and 103 is increased. This increases the breakdown voltage of the transistor so that a transistor device with an excellent RF characteristic is provided.

However, since the conventional SiGe HBT uses silicon (Si) for each of the emitter and collector layers 104 and 102 and the silicon germanium (SiGe) for the base layer, the difference between the respective band gaps of Si and SiGe is about 0.5 eV, which is relatively small. Accordingly, the energy difference $\Delta E_V$ between respective valence bands in an emitter/base junction portion and a collector/base junction portion is not sufficiently large. This causes the problem that the breakdown voltage and the current gain cannot be increased any more.

SUMMARY OF THE INVENTION

It is therefore an object of the present invention to solve the foregoing conventional problem and thereby provide a heterobipolar transistor device with sufficiently increased breakdown voltage and current gain.

To attain the object, a bipolar transistor device according to the present invention uses a semiconductor material having a band gap larger than that of silicon (Si) for each of the emitter and collector layers thereof.

Specifically, a bipolar transistor device according to the present invention comprises: first and second semiconductor layers each formed on a substrate and composed of a Group III–V compound semiconductor of a first conductivity type; and a third semiconductor layer formed between the first and second semiconductor layers and composed of a Group IV semiconductor of a second conductivity type.

In the bipolar transistor device according to the present invention, the third semiconductor layer of the second conductivity type is disposed between the first and second semiconductor layers each of the first conductivity type so that one of the first and second semiconductor layers serves as an emitter layer and the other thereof serves as a collector layer, while the third semiconductor layer serves as a base layer. Each of the first and second semiconductor layers according to the present invention is composed of a Group III–V semiconductor having a band gap larger than that of a Group IV semiconductor composing the third semiconductor layer so that the energy differences between respective valence bands in the junctions portions between the first and third semiconductor layers and between the second and third semiconductor layers are larger than in the case where each of the first and second semiconductor layers is composed of silicon. This increases the breakdown voltage and current gain of the transistor device.

In addition, the energy difference between respective valence bands in the third and first semiconductor layers or in the third and second semiconductor layers is also increased. This allows an increase in the impurity concentration of the third semiconductor layer and reduces the sheet resistance of the third semiconductor layer, thereby allowing a reduction in the impurity concentration of the one of the first and second semiconductor layers serving as the emitter layer. The impurity concentration of the emitter layer can also be reduced so that a junction capacitance in the emitter layer is reduced. This increases a current-gain cutoff frequency and a maximum oscillating frequency.

In the bipolar transistor device according to the present invention, the Group III–V compound semiconductor preferably contains nitrogen and gallium and the Group IV semiconductor is preferably composed of silicon.

In the bipolar transistor device according to the present invention, the Group III–V compound semiconductor preferably contains nitrogen and gallium and the Group IV semiconductor is preferably a compound semiconductor containing silicon and germanium. If the compound semiconductor containing silicon and germanium is used for the third semiconductor layer serving as the base layer, the energy differences between the respective valence bands in the third and first semiconductor layers and in the third and second semiconductor layers become larger than in the case where the third semiconductor layer is composed only of silicon so that the breakdown voltage is further increased.

A method for fabricating a bipolar transistor device according to the present invention comprises: a first step of forming, on a substrate, a first mask pattern composed of an insulating film and selectively growing, on the substrate, a first semiconductor layer composed of a Group III–V compound semiconductor of a first conductivity type by using the first mask pattern formed; a second step of forming, on the first semiconductor layer, a second mask pattern composed of an insulating film and selectively growing, on the first semiconductor layer, a second semiconductor layer composed of a Group IV semiconductor of a second conductivity type by using the second mask pattern formed; and a third step of forming, on the second semiconductor layer, a third mask pattern composed of an insulating film and selectively growing, on the second semiconductor layer, a third semiconductor layer composed of a Group III–V compound semiconductor of the first conductivity type by using the third mask pattern formed.

In the method for fabricating a bipolar transistor according to the present invention, the Group III–V compound semiconductor preferably contains nitrogen and gallium and the Group IV semiconductor is preferably composed of silicon.

In the method for fabricating a bipolar transistor according to the present invention, the Group III–V compound semiconductor preferably contains nitrogen and gallium and the Group IV semiconductor is preferably a compound semiconductor containing silicon and germanium.

In the method for fabricating a bipolar transistor according to the present invention, the substrate is preferably composed of silicon of the second conductivity type and the first step preferably includes, prior to the growth of the first semiconductor layer: the step of growing, on the substrate, a first buffer layer composed of a compound semiconductor containing nitrogen and gallium.

In the method for fabricating a bipolar transistor according to the present invention, the second step preferably includes, prior to the growth of the first semiconductor layer: the step of growing, on the first semiconductor layer, a second buffer layer composed of a compound semiconductor containing nitrogen and gallium.

In the method for fabricating a bipolar transistor according to the present invention, the insulating film is preferably composed of a silicon nitride. This ensures selective growth of the first to third semiconductor layers.

BRIEF DESCRIPTION OF THE DRAWINGS

FIGS. 1A and 1B show a bipolar transistor device according to an embodiment of the present invention, of which FIG. 1A is a structural cross-sectional view and FIG. 1B is an electron energy band diagram;

FIGS. 9A and 9B show a conventional heterobipolar transistor device, of which FIG. 9A is a structural cross-sectional view and FIG. 9B is an electron energy band diagram.

DETAILED DESCRIPTION OF THE INVENTION

Referring now to the drawings, an embodiment of the present invention will be described.

Figure 1A:
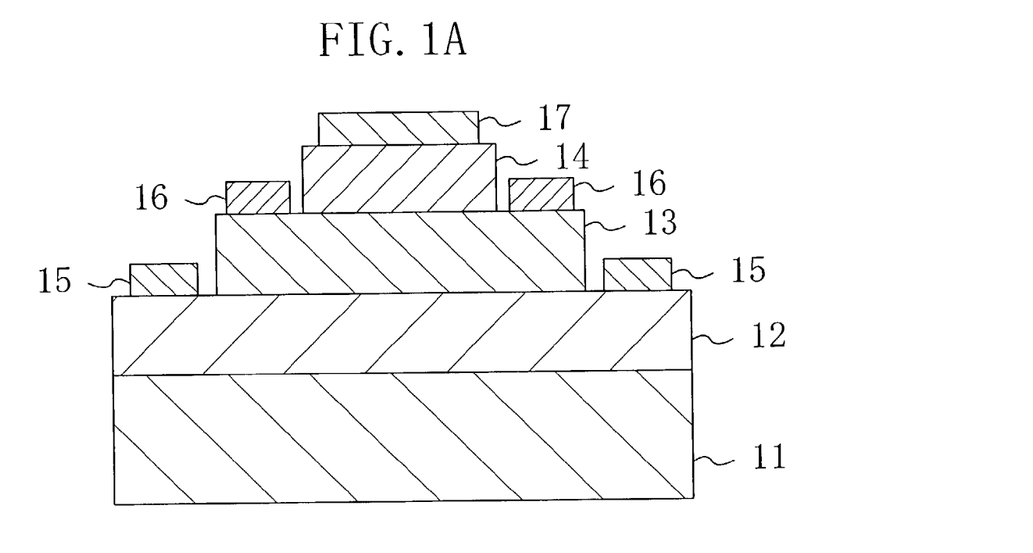

FIG. 1A show a cross-sectional structure of a bipolar transistor device according to the embodiment.

As shown in FIG. 1A, a collector layer 12 composed of an n-type gallium nitride (GaN), a base layer 13 composed of a p-type silicon germanium (SiGe), and an emitter layer 14 composed of an n-type gallium nitride (GaN) are formed successively by selective growth on a semiconductor substrate 11 composed of p-type silicon (Si).

As the ions of an n-type impurity, impurity ions of a Group VI element other than silicon (Si) and oxygen (O), such as selenium (Se) or tellurium (Te), are used, while the ions of boron (B) are used as the ions of a p-type impurity.

The base layer 13 is formed to have a mesa configuration on the collector layer 12. A collector electrode 15 composed of titanium (Ti) and aluminum (Al) is disposed on the collector layer 12 to surround the base layer 13.

The emitter layer 14 is also formed to have a mesa configuration on the base layer 13. A base electrode 16 composed of titanium (Ti) is disposed on the base layer 13 to surround the emitter layer 14, while an emitter electrode 17 composed of titanium (Ti) and aluminum (Al) is disposed on the upper surface of the emitter layer 14.

Each of the collector and base electrodes 15 and 16 may have an annular plan configuration or may be composed of a plurality of discrete electrodes.

Figure 1B:
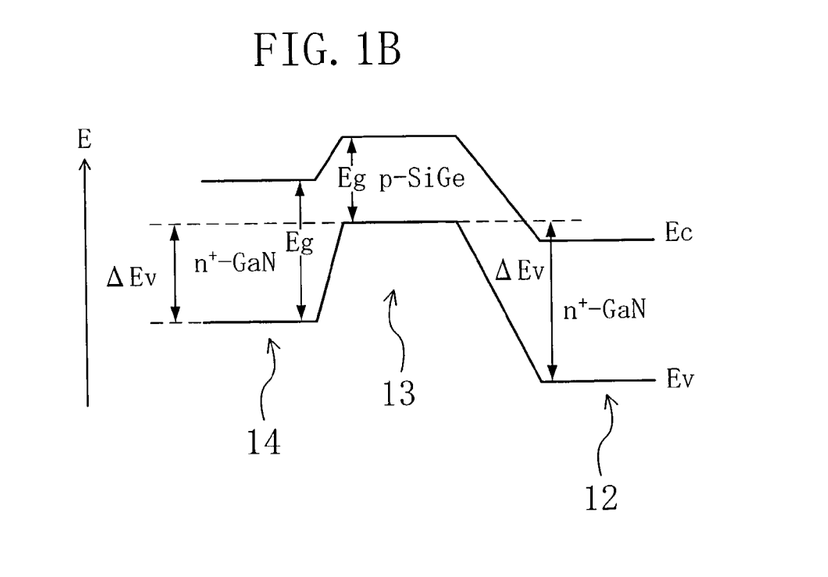

According to the present embodiment, the band gap $E_G$ of the silicon germanium (SiGe) composing the base layer 13 is about 0.8 eV and the band gap $E_G$ of the gallium nitride (GaN) composing the emitter layer 14 and the collector layer 12 is about 3.25 eV, as shown in the band diagram of FIG. 1B. Accordingly, the difference between the band gap of GaN composing each of the emitter layer 14 and the collector layer 12 and the band gap of SiGe composing the base layer 13 is as large as about 2.5 eV Accordingly, each of the energy difference $\Delta E_v$ between respective valence bands in the emitter and base layers 14 and 13 and the energy difference $\Delta E_v$ between respective valence bands in the collector and base layers 12 and 13 is increased to a degree higher than in the conventional SiGe HBT so that the breakdown voltage and current gain of the transistor device are increased.

A buffer layer composed of GaN in about one molecular layer may also be formed between the semiconductor substrate 11 and the collector layer 12. Alternatively, a buffer layer composed of GaN may also be grown at a relative low temperature between the collector and base layers 12 and 13 or between the base and emitter layers 13 and 14.

A description will be given herein below to a method for forming a heterojunction composed of silicon (Si) and a gallium nitride (GaN). In the embodiment, GaN/Si represents the case where a GaN layer is grown on a Si layer and Si/GaN represents the case where a Si layer is grown on a GaN layer.

Since Si and GaN have different lattice constants and different thermal expansion coefficients, misfit dislocation resulting from crystal lattice mismatch occurs at the GaN/Si interface or at the Si/GaN interface.

In the GaN/Si junction, the lattice constant of Si is 5.43 Å and the lattice constant of GaN of zinc blende type is 4.53 Å so that the difference therebetween is about 16%. However, "Technical Report of IEICE, OPE94-103(1994), M. Kondow" has reported that, since GaN is 17% shorter in bond length than Si, lattice matching occurs between GaN and Si and a multilayer structure can be formed from GaN and Si without the occurrence of the misfit location. In addition, a crack resulting from the different thermal expansion coefficients of Si and GaN can be circumvented by selective crystal growth which narrows a crystal growing region by using a mask film. Thus, the collector layer 12 composed of GaN can be grown on the substrate 11 composed of Si.

On the other hand, Si/GaN growth is also possible as reported by Supratic Guha (Appl. Phys. Lett., Vol. 76, No. 10, pp. 1264–1266 (2000)).

As a result of making various examinations, the present inventors have reached the following finding concerning the growth of a SiGe layer on a GaN layer (SiGe/GaN) and the growth of a GaN layer on a SiGe layer (GaN/SiGe).

If SiGe is used for the base layer 13, Si has a lattice constant of 5.43 Å and Ge has a lattice constant of 5.66 Å so that the difference therebetween is as small as about 4%. Even in SiGe in which a Ge composition ratio is high, the difference in lattice constant between SiGe and GaN is about 20%, which is lower than the difference in lattice constant between GaN and sapphire. This proves that each of the SiGe/GaN and GaN/SiGe combinations allows the growth a semiconductor crystal which is sufficiently excellent to form a transistor device.

Since the base layer 13 according to the present embodiment is composed of SiGe having a band gap smaller than that of Si, the use of SiGe for the base layer 13 provides a higher breakdown voltage than the use of Si.

The current gain β of the bipolar transistor device according to the present embodiment is given by the expressions (1) and (2):

$$\beta = I_C / I_{Bh} \quad (1)$$

$$= (N_e v_b^e / P_b v_e^h) \cdot \exp(\Delta E / kT) \quad (2)$$

where $I_c$ represents a collector current, $I_{Bh}$ represents a reverse-hole-injection base current, $N_e$ represents an n-type impurity concentration in the emitter layer, $P_b$ represents a p-type impurity concentration in the base layer, $v_b^e$ represents an electron speed in the base layer, $v_e^h$ represents a hole speed in the emitter layer, $\Delta E$ represents the band gap difference between the emitter and the base, k represents the Boltzmann constant, and T represents an absolute temperature.

From the expression (1), it will be understood that the current gain β is larger as the reverse-hole-injection base current $I_{Bh}$ is smaller. From the expression (2), it will be understood that the current gain β is larger as the band gap difference $\Delta E$ is larger.

The current-gain cutoff frequency $f_T$ is given by the expressions (3) and (4) and the maximum oscillating frequency $f_{max}$ is given by the expression (5).:

$$f_T = g_m / \{2\pi(C_{bc} + C_{eb})\} \quad (3)$$

$$g_m = (q/kT)I_c \quad (4)$$

$$f_{max} = \sqrt{f_T} / \sqrt{(8\pi C_{bc} R_B)} \quad (5)$$

where $g_m$ represents a transconductance, $C_{bc}$ represents a base-to-collector capacitance, $C_{eb}$ represents an emitter-to-base capacitance, and $R_B$ represents a base resistance.

From the expression (3), it will be understood that the current-gain cutoff frequency $f_T$ is higher as the collector current $I_c$ shown in the expression (4) is larger. From the expressions (3) and (5), it will be understood that the maximum oscillating frequency $f_{max}$ is also higher as the collector current $I_c$ is larger.

From the foregoing, it can be concluded that the collector current $I_c$ is larger as the collector-to-base or base-to-emitter band gap difference $\Delta E$ is increased. This allows an increase in the impurity concentration of the base layer 13 and reduces the resistance of the base layer 13.

Although the present embodiment has used silicon germanium (SiGe) for the base layer 13, a material composing the base layer 13 is not limited to a Group IV–IV compound semiconductor composed of SiGe. It is also possible to use a single-element Group IV semiconductor such as Si or Ge to compose the base layer 13. The collector and emitter layers 12 and 14 may also be composed of a Group III element doped with aluminum (Al) or of a Group III–V compound semiconductor using phosphorus (P) as the Group V element, such as GaP.

A material composing the semiconductor substrate 11 is not limited to Si. A sapphire substrate or an SOI substrate may also be used as the semiconductor substrate 11.

Although the n-type collector layer 12, the p-type base layer 13, and the n-type emitter layer 14 are provided in this order on the semiconductor substrate 11 in the present embodiment, an n-type emitter layer, a p-type base layer, and an n-type collector layer may also be provided in this order on the substrate.

It is also possible to provide a pnp bipolar transistor device obtained by switching the respective conductivity types of the collector layer 12, the base layer 13, and the emitter layer 14.

A description will be given herein below to a method for fabricating the bipolar transistor device thus constructed.

FIGS. 2A to 2C and FIGS. 8A to 8C show the cross sections of the bipolar transistor device according to the embodiment of the present invention in the individual process steps of a fabrication method therefor.

Figure 2A:
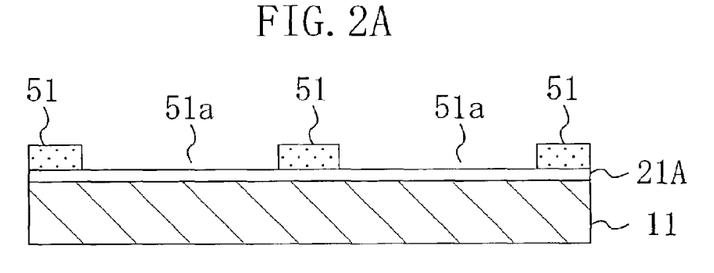
FIGS. 2A to 2C show the cross-sectional structures of the bipolar transistor device according to the embodiment in the individual process steps of a fabrication method therefor.

First, as shown in FIG. 2A, a first insulating film 21A composed of a silicon nitride ($Si_3N_4$) is deposited by, e.g., CVD over the entire principal surface of the semiconductor substrate 11 composed of p-type silicon (Si). Then, a first resist pattern 51 having openings 51a corresponding to regions to be formed with collectors is formed by photolithography on the first insulating film 21A.

Figure 2B:
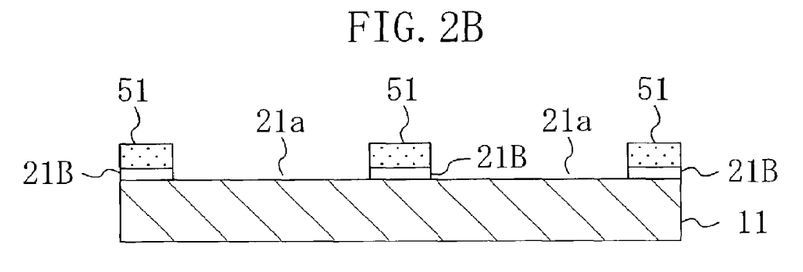

Next, as shown in FIG. 2B, dry etching is performed with respect to the first insulating film 21A masked with the first resist pattern 51 to form, from the first insulating film 21A, a first mask pattern 21B having openings 21a corresponding to the collector formation regions.

Figure 2C:
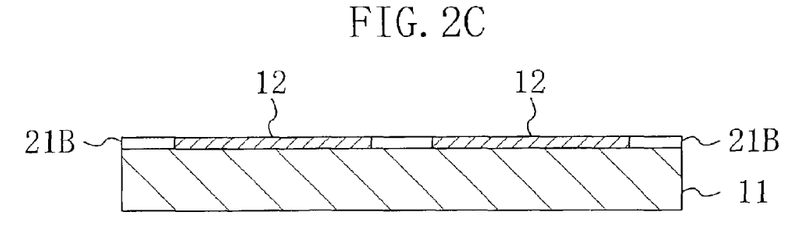

Next, as shown in FIG. 2C, the first resist pattern 51 is removed. Then, the collector layers 12 composed of the n-type gallium nitride (GaN) are grown selectively on the semiconductor substrate 11 by, e.g., metal organic vapor phase epitaxy (MOVPE) using the openings 21a of the first mask pattern 21B.

Figure 3A:
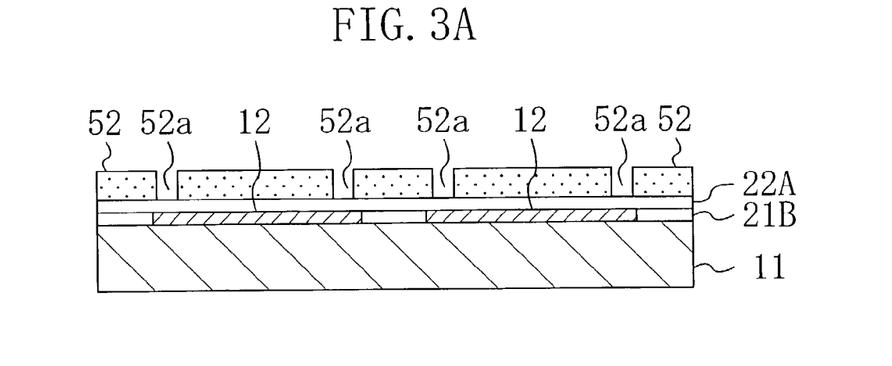
FIGS. 3A to 3C show the cross-sectional structures of the bipolar transistor device according to the embodiment in the individual process steps of the fabrication method therefor.

Next, as shown in FIG. 3A, a second insulating film 22A composed of a silicon nitride is deposited by CVD entirely over the collector layers 12 and the first mask pattern 21B. Then, a second resist pattern 52 having openings 52a corresponding to the corrector electrode formation regions which are located over the end portions of the collector layers 12 is formed by photolithography on the second insulating film 22A. Prior to the deposition of the second insulating film 22A, a planarization process may also be performed with respect to the upper surfaces of the collector layer 12 and the first mask pattern 21B.

Figure 3B:
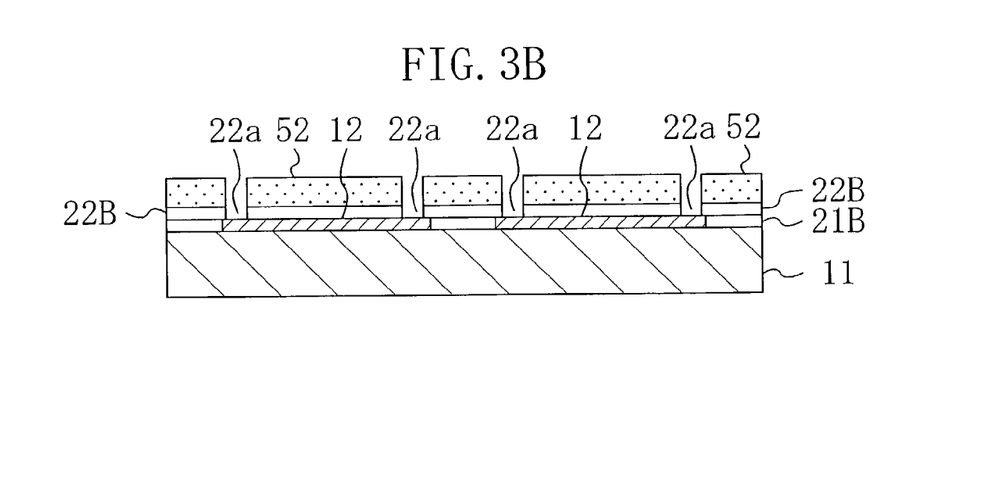

Next, as shown in FIG. 3B, dry etching is performed with respect to the second insulating film 22A masked with the second resist pattern 52, thereby forming, from the second insulating film 22A, a second mask pattern 22B having openings 22a corresponding to the collector electrode formation regions.

Figure 3C:
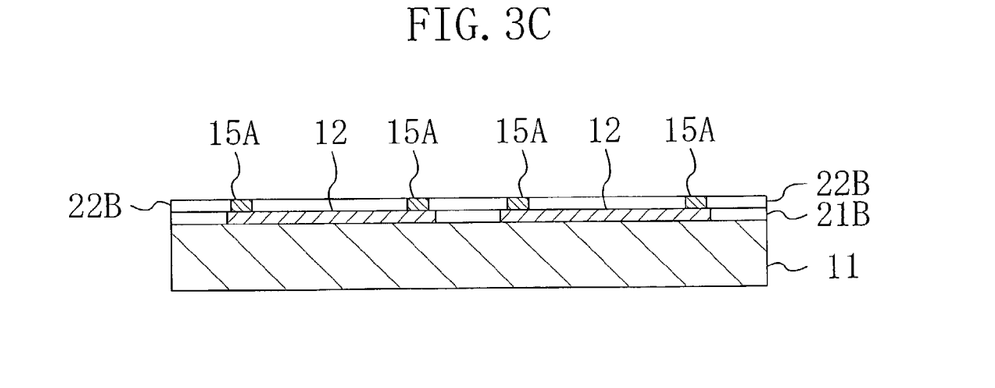

Next, as shown in FIG. 3C, the second resist pattern 52 is removed. Then, a multilayer film composed of titanium (Ti) and aluminum (Al) is formed by, e.g., sputtering to fill in the openings 22a of the second mask pattern 22B. Subsequently, the portion of the multilayer film located on the second mask pattern 22B is removed so that lower collector electrodes 15A composed of the multilayer film is formed in the openings 22a.

Figure 4A:
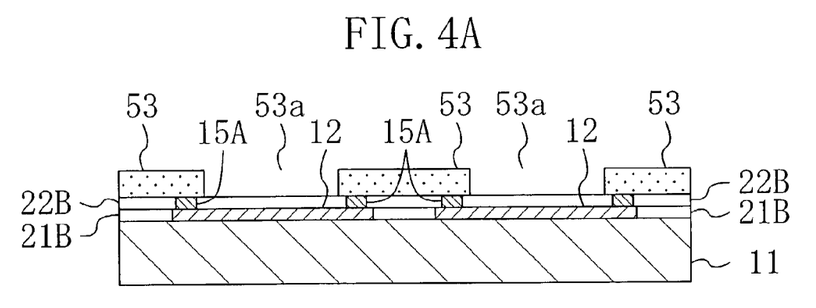
FIGS. 4A to 4C show the cross-sectional structures of the bipolar transistor device according to the embodiment in the individual process steps of the fabrication method therefor.

Next, as shown in FIG. 4A, a third resist pattern 53 having openings 53a corresponding to regions to be formed with bases which are located over the collector layers 12 and internally of the lower collector electrodes 15A is formed by photolithography over the second mask pattern 22B and the lower collector electrodes 15A.

Figure 4B:
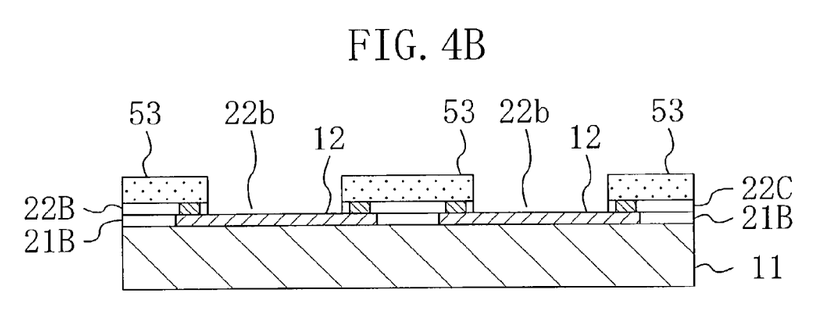

Next, as shown in FIG. 4B, dry etching is performed with respect to the second mask pattern 22B masked with the third resist pattern 53, thereby forming, from the second mask pattern 22B, a third mask pattern 22C having openings 22b corresponding to the base formation regions.

Figure 4C:
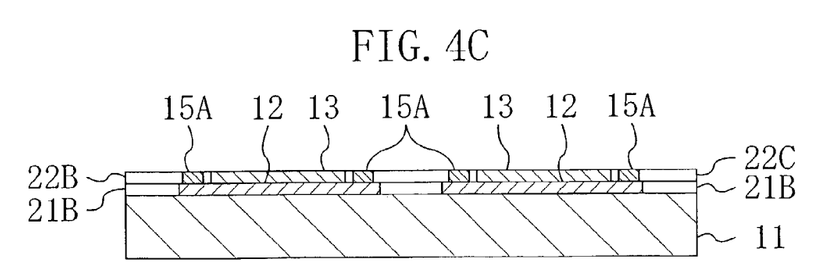

Next, as shown in FIG. 4C, the third resist pattern 53 is removed. Then, the base layers 13 composed of the p-type silicon germanium (SiGe) are grown selectively on the collector layers 12 by CVD or the like using the openings 22b of the third mask pattern 22C. Thereafter, the base layers 13, the lower collector electrodes 15A, and the third mask pattern 22C have their upper surfaces planarized.

Figure 5A:
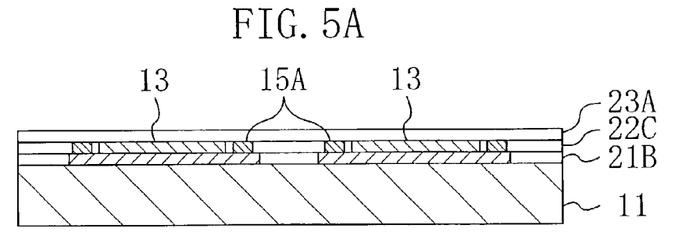
FIGS. 5A to 5C show the cross-sectional structures of the bipolar transistor device according to the embodiment in the individual process steps of the fabrication method therefor.

Next, as shown in FIG. 5A, a third insulating film 23A composed of a silicon nitride is deposited by CVD entirely over the base layers 13 and the third mask pattern 22C.

Figure 5B:
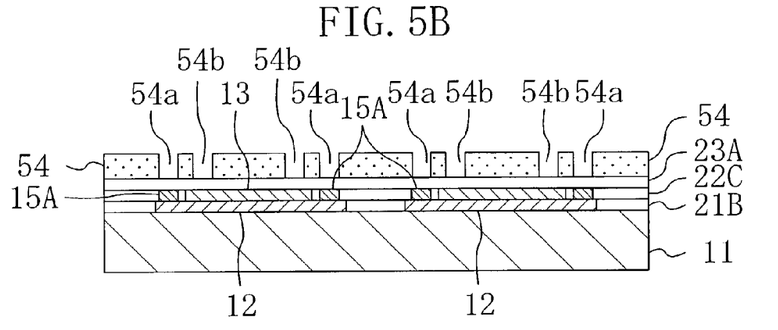

Next, as shown in FIG. 5B, a fourth resist pattern 54 having first openings 54a corresponding to the collector electrode formation regions which are located over the lower collector electrodes 15A and second openings 54b corresponding to the base electrode formation regions which are located over the end portions of the base layers 13 is formed by photolithography on the third insulating film 23A.

Figure 5C:
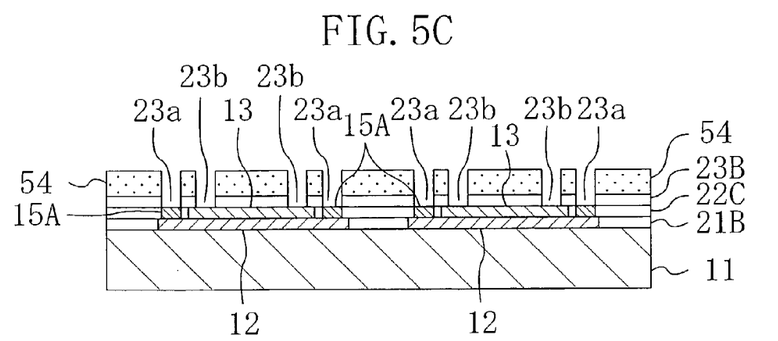

Next, as shown in FIG. 5C, dry etching is performed with respect to the third insulating film 23A masked with the fourth resist pattern 54, thereby forming, from the third insulating film 23A, a fourth mask pattern 23B having first openings 23a corresponding to the collector electrode formation regions and the second openings 23b corresponding to the base electrode formation regions.

Figure 6A:
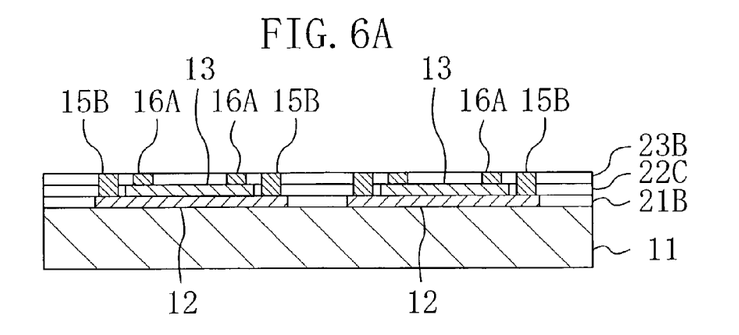
FIGS. 6A to 6C show the cross-sectional structures of the bipolar transistor device according to the embodiment in the individual process steps of the fabrication method therefor.

Next, as shown in FIG. 6A, the fourth resist pattern 54 is removed. Then, a conductor film composed of Ti is formed by, e.g., sputtering to fill in the first and second openings 23a and 23b of the fourth mask pattern 23B. Subsequently, the portion of the conductor film located on the fourth mask pattern 23B is removed so that intermediate collector electrodes 15B composed of the conductor film are formed in the first openings 23a to be connected to the lower collector electrodes 15A, while lower base electrodes 16A composed of the conductor film are formed in the second openings 23b.

Figure 6B:
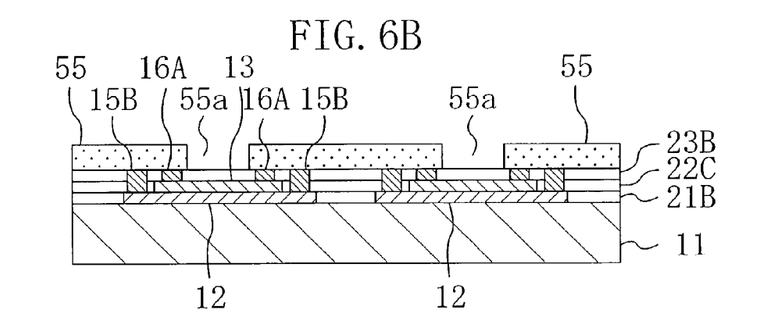

Next, as shown in FIG. 6B, a fifth resist pattern 55 having openings 55a corresponding to regions to be formed with emitters which are located over the base layers 13 and internally of the lower base electrodes 16A are formed by photolithography over the fourth mask pattern 23B, the intermediate collector electrodes 15B, and the lower base electrodes 16A.

Figure 6C:
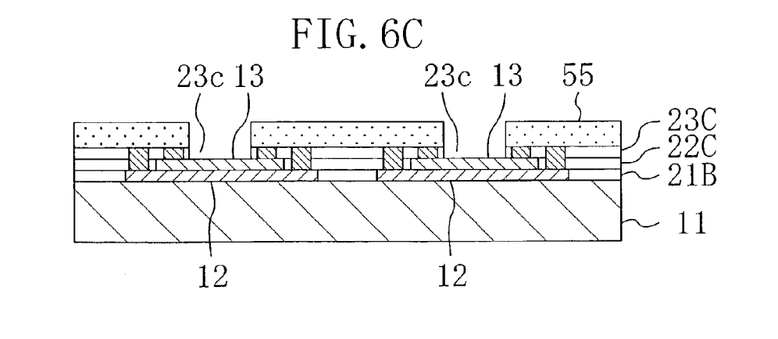

Next, as shown in FIG. 6C, dry etching is performed with respect to the fourth mask pattern 23B masked with the fifth resist pattern 55, thereby forming, from the fourth mask pattern 22B, a fifth mask pattern 23C having openings 23c corresponding to the emitter formation regions.

Figure 7A:
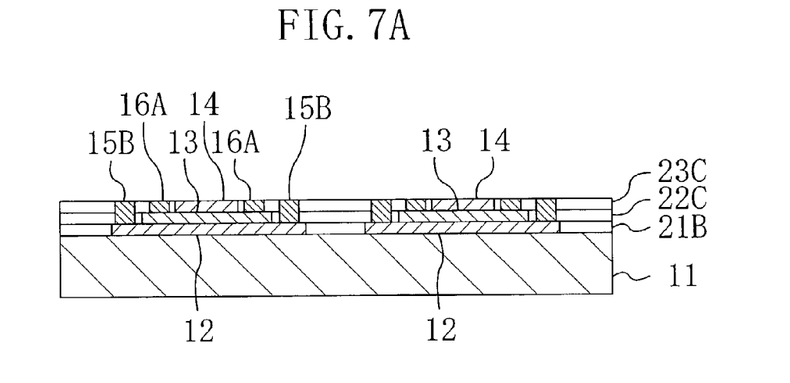
FIGS. 7A to 7C show the cross-sectional structures of the bipolar transistor device according to the embodiment in the individual process steps of the fabrication method therefor.

Next, as shown in FIG. 7A, the fifth resist pattern 55 is removed. Then, the emitter layers 14 composed of n-type GaN are grown selectively on the base layer 13 by MOVPE or the like using the openings 23c of the fifth mask pattern 23C. Then, the emitter layers 14, the intermediate collector electrodes 15B, the lower base electrodes 16A, and the fifth mask pattern 23C have their upper surfaces planarized.

Figure 7B:
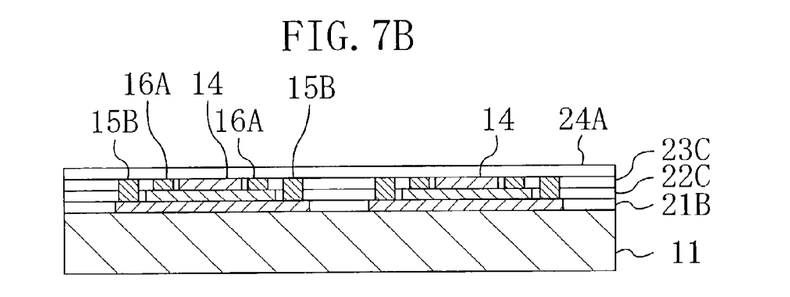

Next, as shown in FIG. 7B, a fourth insulating film 24A composed of a silicon nitride is deposited by CVD entirely over the emitter layers 14, the intermediate collector electrodes 15B, the lower base electrodes 16A, and the fifth mask pattern 23C.

Figure 7C:
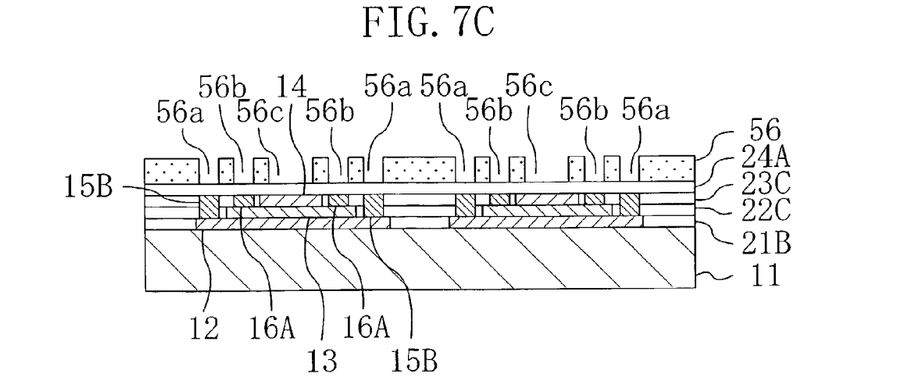

Next, as shown in FIG. 7C, a sixth resist pattern 56 having first openings 56a corresponding to the collector electrode formation regions which are located over the intermediate collector electrodes 15B, second openings 56b corresponding to the base electrode formation regions which are located over the lower base electrodes 16A, and third openings 56c corresponding to the emitter electrode formation regions which are located over the emitter layers 14 and internally of the lower base electrodes 16A is formed by photolithography on the fourth insulating film 24A.

Figure 8A:
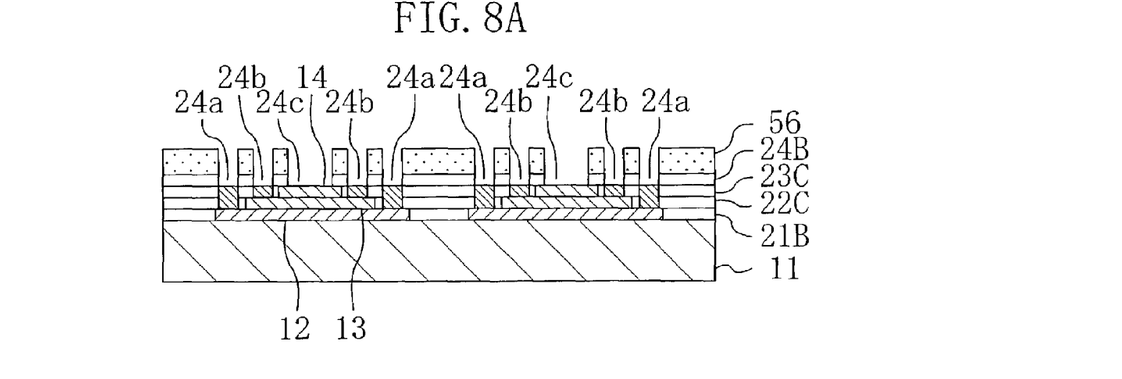
FIGS. 8A to 8C show the cross-sectional structures of the bipolar transistor device according to the embodiment in the individual process steps of the fabrication method therefor.

Next, as shown in FIG. 8A, dry etching is performed with respect to the fourth insulating film 24A masked with the sixth resist pattern 56, thereby forming, from the fourth insulating film 24A, a sixth mask pattern 24B having first openings 24a corresponding to the collector electrode formation regions, second openings 24b corresponding to the base electrode formation regions, and third openings 24c corresponding to the emitter electrode formation regions.

Figure 8B:
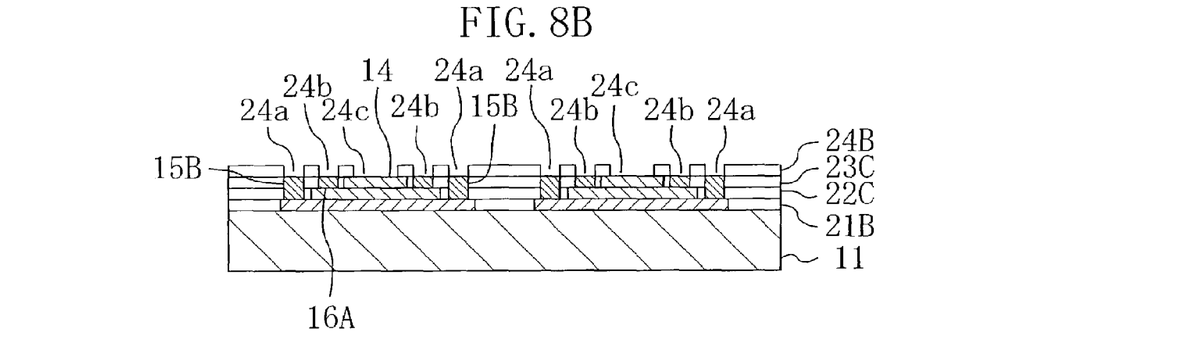
Figure 8C:
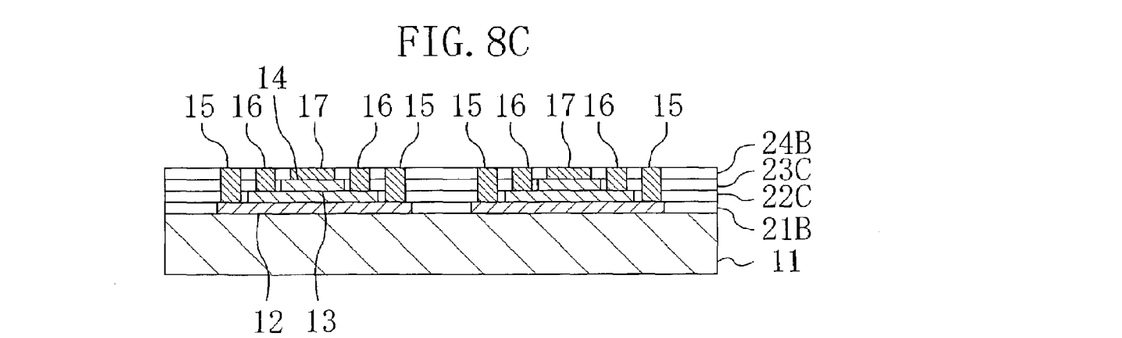

Next, as shown in FIG. 8B, the sixth resist pattern 56 is removed and then a multilayer film composed of Ti and Al is formed by, e.g., sputtering to fill in the first, second, and third openings 24a, 24b, and 24c of the sixth mask pattern 24B. Subsequently, the portion of the multilayer film located on the sixth mask pattern 24B is removed so that the collector electrodes 15 are formed in the first openings 24a to be connected to the intermediate collector electrode 15B. Likewise, the base electrodes 15 are formed in the second openings 24b to be connected to the lower base electrodes 16A and the emitter electrodes 17 are formed in the third openings 24c, whereby the bipolar transistor device according to the present embodiment is implemented.

What is claimed is:

1. A bipolar transistor device comprising:
    a collector layer and an emitter layer, each formed on a substrate and composed of a Group III–V compound semiconductor of a first conductivity type; and
    a base layer formed between the collector layer and emitter layer and composed of a Group IV semiconductor of a second conductivity type;
    wherein a band gap difference exists between the base layer and the collector layer, and the Group III–V compound semiconductor contains nitrogen and gallium and the Group IV semiconductor consists of silicon.

2. A bipolar transistor device comprising:
a collector layer and an emitter layer, each formed on a substrate and composed of a Group III–V compound semiconductor of a first conductivity type; and
a base layer formed between the collector layer and emitter layer and composed of a Group IV semiconductor of a second conductivity type;
wherein a band gap difference exists between the base layer and the collector layer, and the Group III–V compound semiconductor contains nitrogen and gallium and the Group IV semiconductor is a compound semiconductor consisting of silicon and germanium.

* * * * *